(12) United States Patent
Hsieh et al.

(10) Patent No.: US 8,972,916 B1
(45) Date of Patent: Mar. 3, 2015

(54) METHOD AND SYSTEM FOR CHECKING THE INTER-CHIP CONNECTIVITY OF A THREE-DIMENSIONAL INTEGRATED CIRCUIT (71) Applicant: Taiwan Semiconductor Manufacturing Co., Ltd., Hsin-Chu (TW)

(72) Inventors: Yao-Jen Hsieh, Taipei (TW); Kai-Ming Liu, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 14/097,284

(22) Filed: Dec. 5, 2013

(51) Int. Cl.
*G06F 17/50* (2006.01)

(52) U.S. Cl.
CPC ........ *G06F 17/5081* (2013.01); *G06F 17/5045* (2013.01)
USPC ........... 716/111; 716/102; 716/126; 716/129; 716/136

(58) Field of Classification Search
USPC .......................... 716/102, 111, 126, 129, 136
See application file for complete search history.

(56) References Cited

U.S. PATENT DOCUMENTS

| 5,903,469 | A * | 5/1999 | Ho | 716/115 |
|---|---|---|---|---|
| 6,553,554 | B1 * | 4/2003 | Dahl et al. | 716/119 |
| 6,832,360 | B2 * | 12/2004 | Li | 716/112 |
| 8,386,977 | B2 * | 2/2013 | Farooq et al. | 716/111 |
| 8,516,418 | B2 * | 8/2013 | Singh et al. | 716/106 |
| 8,667,450 | B2 * | 3/2014 | Wang et al. | 716/136 |
| 8,701,055 | B1 * | 4/2014 | Lee et al. | 716/54 |
| 2005/0268258 | A1 * | 12/2005 | Decker | 716/4 |
| 2012/0304138 | A1 * | 11/2012 | Farooq et al. | 716/111 |

* cited by examiner

*Primary Examiner* — Naum B Levin
(74) *Attorney, Agent, or Firm* — Duane Morris LLP (57) ABSTRACT

A method for checking the inter-chip connectivity of a three-dimensional (3D) integrated circuit (IC) generally comprises receiving a design file for each of a plurality of chips of the 3D IC and generating a plurality of inter-layer ports to be shared between at least two of the of chips based on the design files for each of the chips. A layout without the share ports for each of the chips based on the design files for each of the chips is generated and a layout versus schematic (LVS) check is conducted for each of the generated layouts by using the identified inter-layer ports.

20 Claims, 6 Drawing Sheets

METHOD AND SYSTEM FOR CHECKING THE INTER-CHIP CONNECTIVITY OF A THREE-DIMENSIONAL INTEGRATED CIRCUIT

FIELD

This disclosure relates generally to three-dimensional (3D) semiconductor integrated circuits (ICs), and more specifically to electronic design automation (EDA) and simulation tools for 3D IC design.

BACKGROUND

A recent trend in semiconductor memories is to fabricate three-dimensional (3D) semiconductor integrated circuits (ICs). 3D ICs include a variety of structures, such as die on silicon interposer, stacked dies, multi-tiered, stacked complementary metal oxide semiconductor (CMOS) structures, or the like. These 3D circuits offer a host of advantages over traditional two dimensional circuits, such as lower power consumption, higher memory cell density, greater efficiency, alleviating bottlenecks, shorter critical path delays, and lower area cost to name just a few. Stacked die 3D ICs can be constructed by vertically stacking two dimensional chips and providing power and signal communication connections between the chips, such as, for example, using through-substrate vias (TSV). Alternatively, 3D IC can be constructed using a single die with integrated components arranged in three dimensions into a plurality of tiers. Each tier can have its own active device layer and/or interconnect structure. Each pair of adjacent tiers are separated from each other by an insulating layer or thin semiconductor substrate or layer.

The design process for a new IC includes several steps using automated EDA tools. During initial schematic design, the designer identifies a set of functions to include in the design, along with their standard delays. The designer uses computer implemented tools to perform functional simulation, to ensure that the design performs its intended function(s). Before the schematic design is laid out, the designer performs a pre-simulation. The pre-simulation takes into account device and cell characteristics, to provide an estimate of circuit performance (i.e., performance in both analog and digital designs, including timing performance in digital designs). If the design meets circuit performance requirements in the pre-simulation, the designer initiates the floorplan and layout phases, to generate the actual IC layout, using the place and route engine of the EDA tool. If the pre-simulation identifies significant performance issues, the designer modifies the design before proceeding to layout.

Following the layout process, the user verifies the design by using the EDA tools to perform design rule checks (DRC), layout versus schematic (LVS) checks, and resistance-capacitance (RC) extraction.

DETAILED DESCRIPTION

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The design process for a new three-dimensional (3D) semiconductor integrated circuit (IC) includes several steps, including a process to verify the design of the 3D IC, which also includes checking the inter-chip connectivity of the 3D IC. In at least some techniques, the inter-chip connectivity can be done with a computer executing an LVS program that is used with the different chip layers. When performing such LVS checks, multiple files, such as GDS II files, are imported. However, importing multiple GDS II files can present challenges. For example, import of multiple GDS II files can cause a memory overflow and/or runtime issues.

Some embodiments of the method and system described herein facilitate a technique to check an inter-chip connectivity of a 3D IC without having to import multiple GDS II files. For example, in some embodiments, rather than importing multiple GDS II files, respective design files for each of the chips of the 3D IC are created, and the design files are used to identify a plurality of inter-layer ports or share ports that to be shared between at least two of the chips. Respective layouts without the shareports for each of the chips are generated, and a respective layout versus schematic (LVS) check is conducted for each of the generated layouts, by using the identified inter-layer ports or share ports to check the inter-chip connections. As such, multiple GDS II files are not imported, in which case, memory overflow and/or runtime issues can be avoided.

Figure 1:
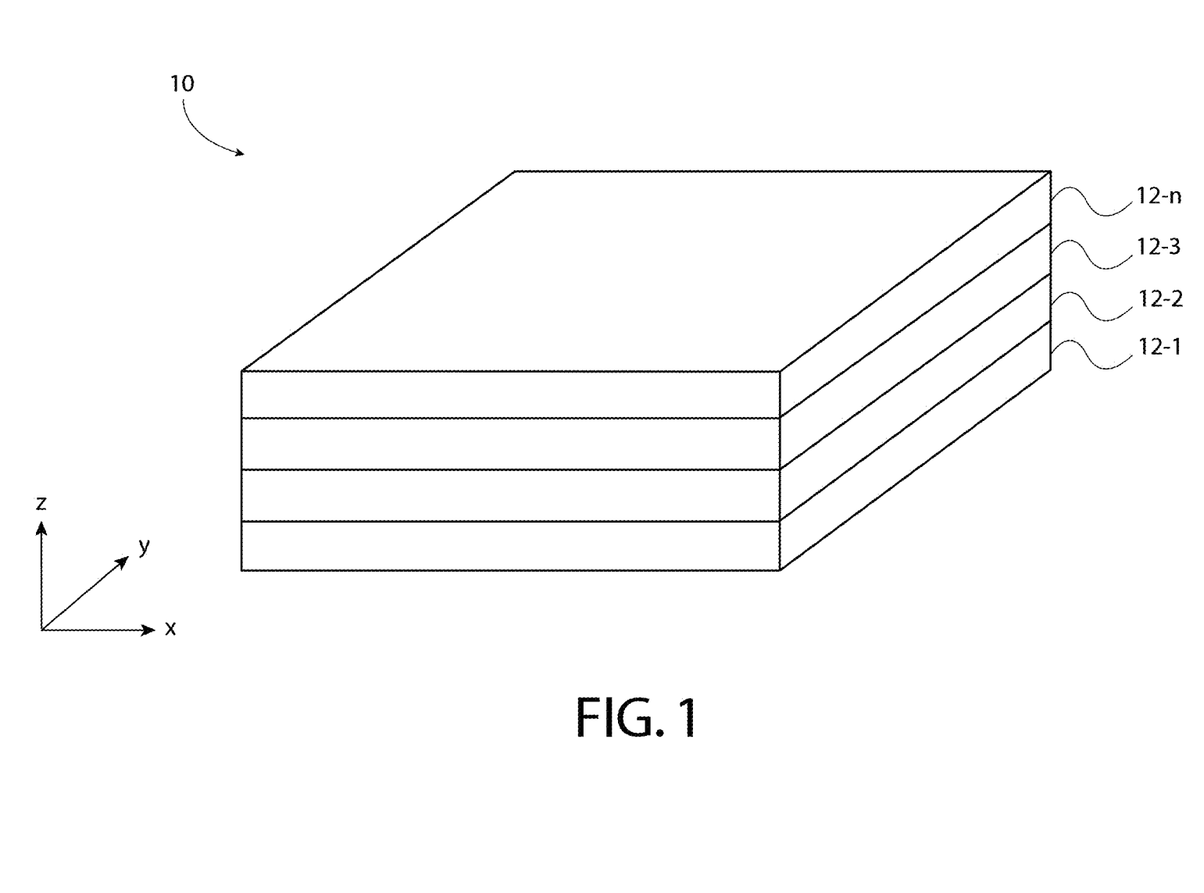
FIG. 1 is a perspective view of one example of a three-dimensional (3D) semiconductor integrated circuit (IC) having a plurality of chips in accordance with some embodiments.

FIG. 1 illustrates one example of a 3D semiconductor IC 10. 3D IC 10 includes a plurality of layers 12-1, 12-2, 12-3, 12-n ("layers 12") that are vertically stacked on top of one another in the z-direction. In some embodiments, layers 12 are individual dies or chips, such as two-dimensional (2D) chips, that are electrically coupled to one another with at least one through-substrate via ("TSV") and microbumps. In some embodiments each chip includes at least one port (not shown) such that a TSV can extend from a port on one chip to a port on another chip. In other embodiments, layers 12 are stacked tiers, that are electrically coupled to one another with at least one inter-layer via ("ILV") or inter-device via ("ILD") (not shown).

In some embodiments, each layer 12 of 3D IC 10 is a respective "tier" where each tier can include a respective active device layer and a respective interconnect structure, which can include a plurality of conductive layers (e.g., M1, M2, etc.). The active device layer of the second and subsequent tiers can include a thin semiconductor substrate or semiconductor layer. In some embodiments, one or more of the upper tiers has no active devices, and an insulating layer can be substituted for the thin semiconductor layer. Each respective interconnect structure can include interlayer dielectric ("ILD") layers (not shown) disposed between directly adjacent tiers. As described in more detail below with respect to the remaining figures, in some embodiments, the inter-chip (or inter-tier) connectivity of 3D IC 10 can be checked by using an EDA tool (not shown in FIG. 1).

Figure 2:
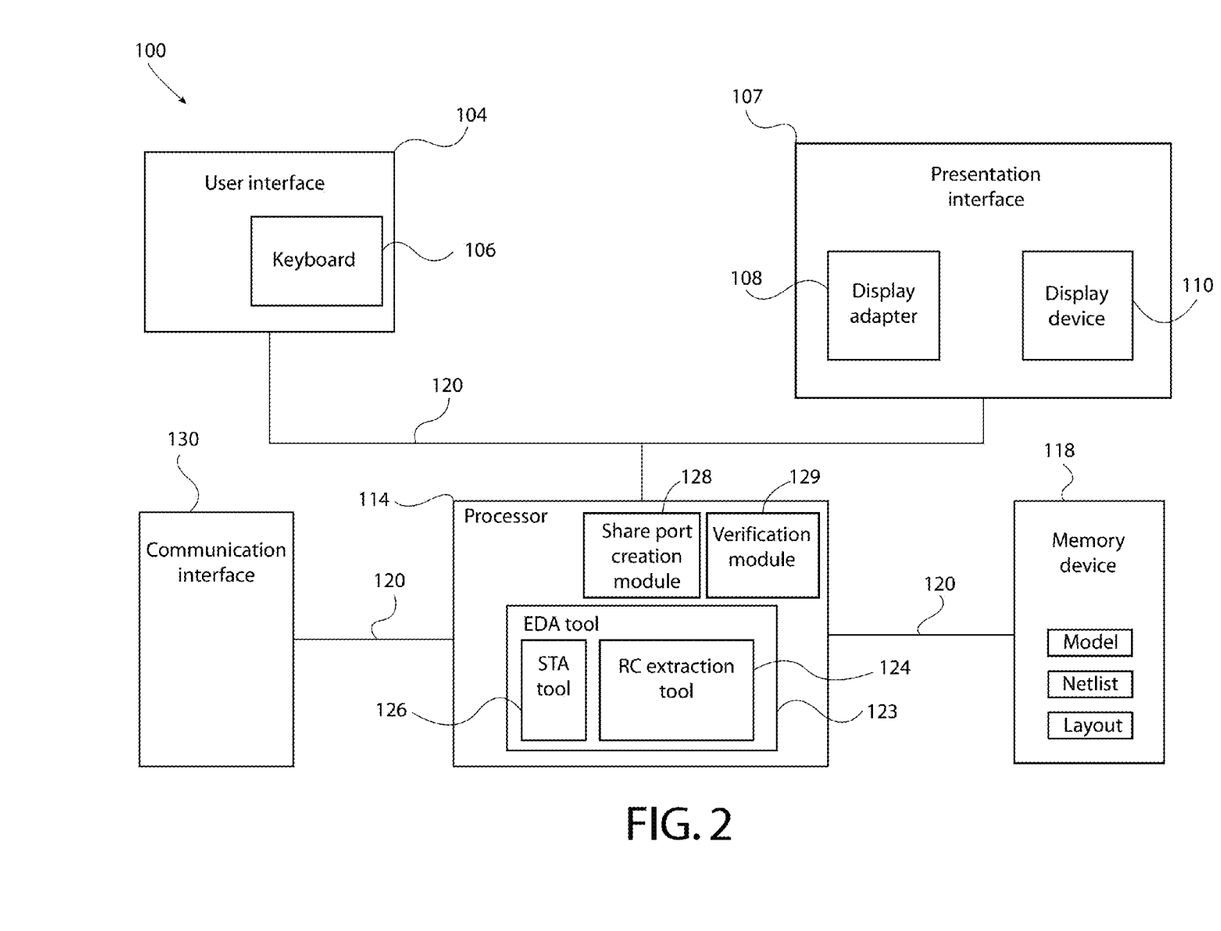
FIG. 2 is a block diagram of one example of a system for modeling the 3D IC shown in FIG. 1 in accordance with some embodiments.

FIG. 2 illustrates a system 100 that is used to design 3D IC 10 (shown in FIG. 1) and to make various determinations regarding 3D IC 10, such as checking the inter-chip connectivity of the design of the 3D IC 10. System 100 can include a computer (e.g., desktop, laptop, tablet or mobile device) system or host that includes a user interface 104 that receives at least one input from a user, such as a designer of 3D IC 10. In some embodiments, user interface 104 includes a keyboard 106 that enables the user to input pertinent information. Alternatively, user interface 104 can include, for example, a pointing device, a mouse, a stylus, a touch sensitive panel (e.g., a touch pad or a touch screen), a gyroscope, an accelerometer, a position detector, and/or an audio input interface (e.g., including a microphone).

In some embodiments, system 100 includes a presentation interface 107 that presents information, such as input events and/or validation results, to the user. For example, presentation interface 107 includes a display adapter 108 that is coupled to at least one display device 110. Display device 110 can be a visual display device, such as a cathode ray tube ("CRT"), a liquid crystal display ("LCD"), an organic LED ("OLED") display, and/or an "electronic ink" display. Alternatively, presentation interface 107 can include an audio output device (e.g., an audio adapter and/or a speaker) and/or a printer.

System 100 also includes a central processor 114 and at least one non-transitory, computer readable storage medium, such as a memory device 118. Processor 114 can be coupled to user interface 104, presentation interface 107, and to memory device 118 via a system bus 120. In some embodiments, processor 114 communicates with the user, such as by prompting the user via presentation interface 107 and/or by receiving user inputs via user interface 104. In some embodiments, the processor 114 communicates with the user interface 104 by a wireless interface, such as a personal area network interface (e.g., "Bluetooth").

In some embodiments, processor 114 is programmed by encoding an operation using one or more executable instructions and by providing the executable instructions in memory device 118. The term "processor" refers generally to any programmable system including systems and microcontrollers, reduced instruction set circuits ("RISC"), application specific integrated circuits ("ASIC"), programmable logic circuits ("PLC"), and any other circuit or processor capable of executing the functions described herein. This description is not intended to limit in any way by the definition and/or meaning of the term "processor."

In some embodiments, memory device 118 includes one or more devices that enable information, such as executable instructions and/or other data, to be stored and retrieved. Moreover, in some embodiments, memory device 118 includes one or more computer readable media, such as, without limitation, dynamic random access memory ("DRAM"), static random access memory ("SRAM"), a solid state disk (e.g., an electrically erasable programmable read only memory (EEPROM) or a flash memory), an optical disk drive and/or a hard disk drive (HDD). In some embodiments, memory device 118 stores, without limitation, application source code, application object code, configuration data, additional input events, application states, assertion statements, validation results, and/or any other type of data.

Processor 114 includes an electronic design automation ("EDA") tool 123. An RC extraction tool 124 and a static timing analysis (STA) tool 126 are each included within EDA tool 123. As explained in more detail below, with respect to FIGS. 3, 4, 5, and 6, EDA tool 123, RC extraction tool 124, and STA tool 126 each include one or more software modules that are executed within processor 114 to facilitate the processes described herein. For example, in some embodiments, as explained in more detail with respect to FIGS. 3, 4, and 5, EDA tool 123 includes a share port creation module 128 that facilitates the creation of interlayer ports that are to be shared between two chip layers, such as between layers 12-1 and 12-2, and a verification module 129 that is used for an LVS check. In one embodiment, EDA tool 123 can include software, such as "IC COMPILER"™, sold by Synopsis, Inc. of Mountain View, Calif., which can include a place and route tool (not shown), such as "ZROUTE"™, also sold by Synopsys, Inc. Other EDA tools 123 can be used, such as the "VIRTUOSO" custom design platform (not shown) or the Cadence "ENCOUNTER"® digital IC design platform (not shown), along with the "VIRTUOSO" chip assembly router (not shown), all sold by Cadence Design Systems, Inc. of San Jose, Calif.

System 100 also includes a communication interface 130 (e.g., IEEE 802.11 or Bluetooth) that is coupled to processor 114 via system bus 120. Moreover, communication interface 130 can be coupled to, for example, a remote terminal (not shown), such as a desktop computer, laptop, mobile device, thin client, or other device. As such, the remote terminal can be capable of displaying applications running inside system 100 to an end user using the remote terminal.

Figure 3:
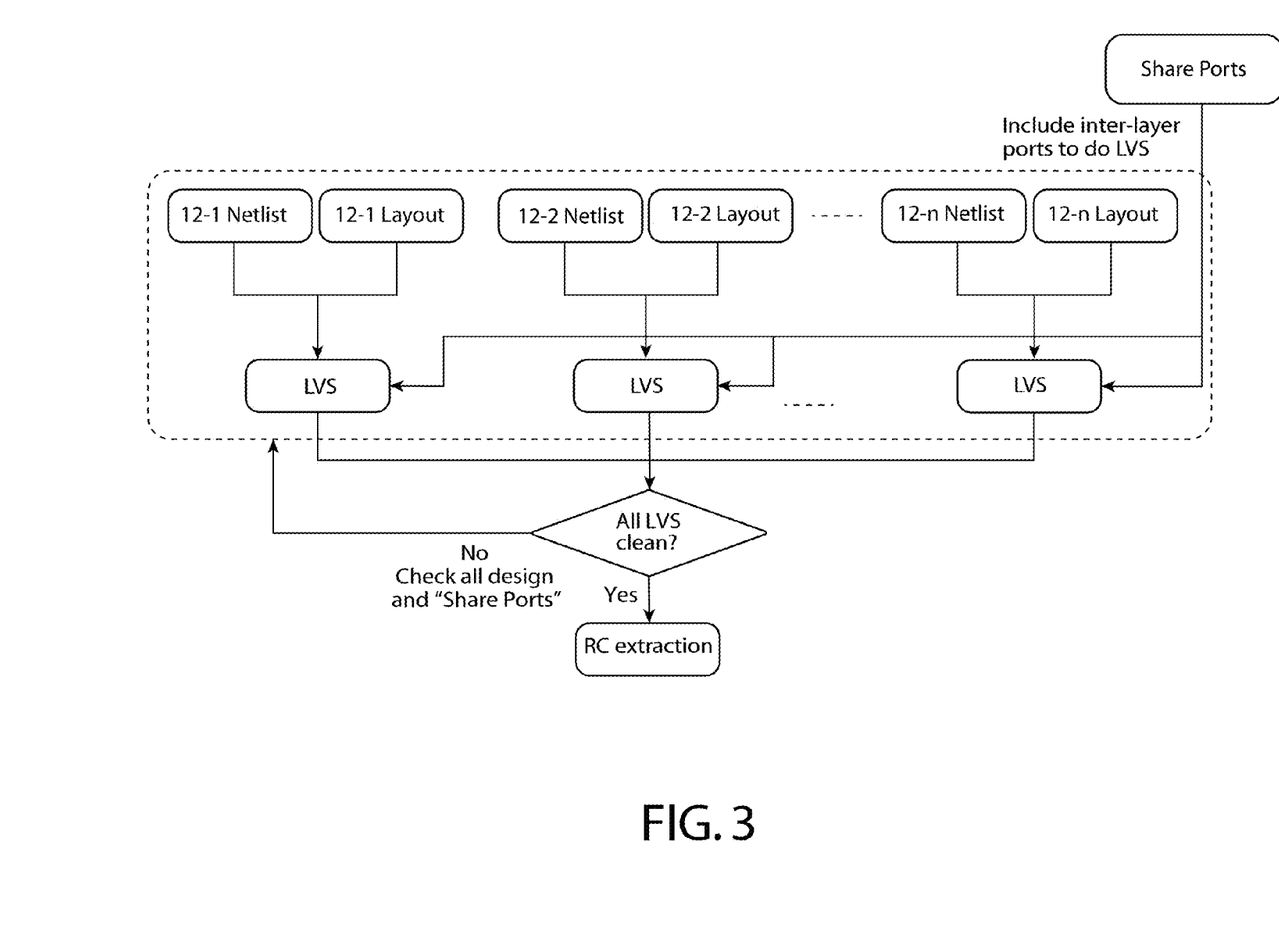
FIG. 3 is a block diagram showing data flow among the elements of the system shown in FIG. 2 in accordance with some embodiments.
Figure 4:
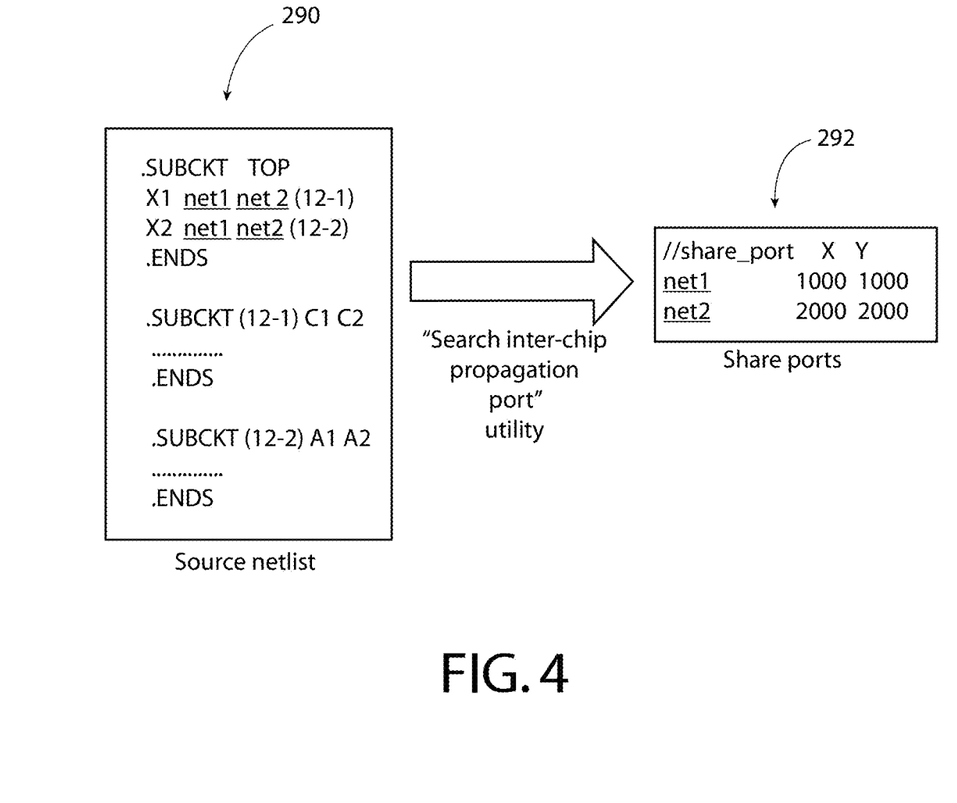
FIG. 4 is a block diagram of one example of determining a plurality of inter-layer ports that are being shared between at least two of the chips of the 3D IC using the system shown in FIG. 2 in accordance with some embodiments.
Figure 5:
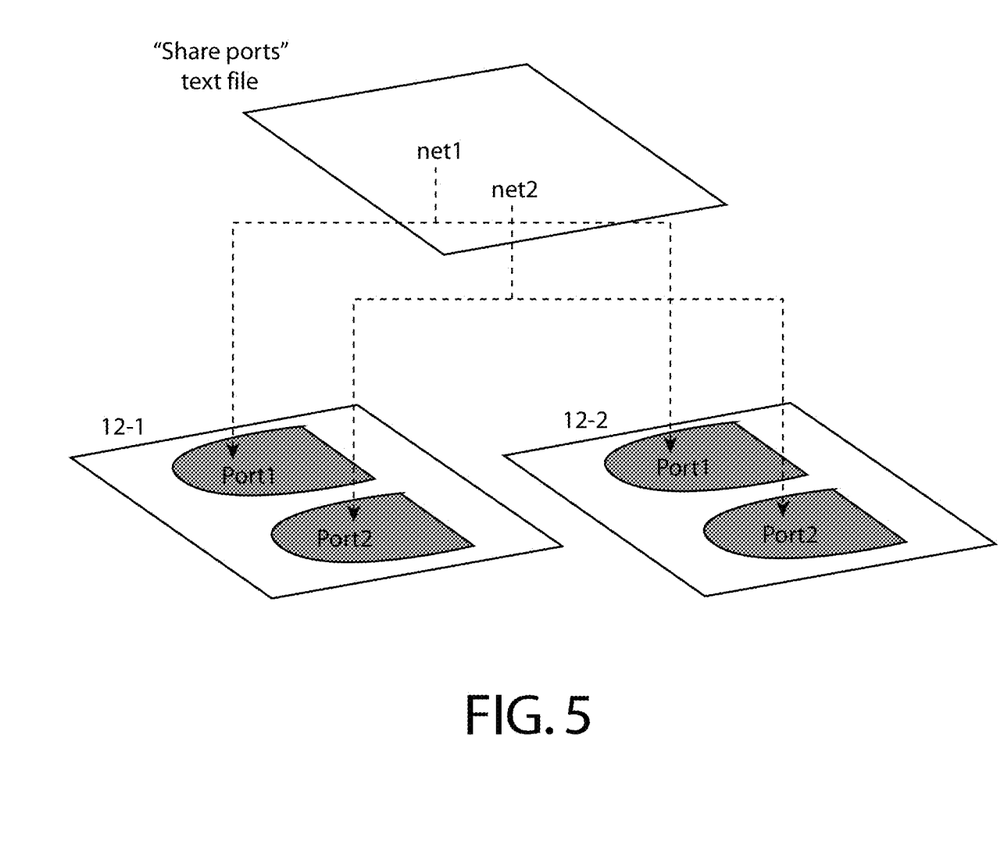
FIG. 5 is a perspective view of one example of a connection between at least two chips of the 3D IC that share at least one inter-layer ports in accordance with some embodiments.

FIG. 3 is a diagram illustrating the data flow among the various processes performed by system 100 (shown in FIG. 2). FIG. 4 is a block diagram of one example of determining a plurality of inter-layer ports that are being shared between at least two of the chips of the 3D IC 10 (shown in FIG. 1) using system 100. FIG. 5 is a perspective view of one example of a connection between at least two chips of the 3D IC 10 that share at least two inter-layer ports.

Referring to FIG. 3, during operation of system 100, system 100 facilitates an inter-chip connectivity check or test of 3D IC 10 (shown in FIG. 1) without having to import multiple GDS II files. In some embodiments, a design file, such as a netlist, is first created for each chip. For example, a netlist is created for chip layer 12-1 (12-1 netlist), chip layer 12-2 (12-2 netlist), and through chip layer 12-n (12-n netlist). Each netlist can be saved to memory device 118 (shown in FIG. 2, within block 118).

The netlists for each of the chip layers are then used to identify or determine a plurality of inter-layer ports or share ports that are being shared between at least two of the chip layers, such as 12-1 and 12-2. For example, as shown in FIG. 4, EDA tool 123 (shown in FIG. 2) uses each netlist that is generated for each chip layer, such as 12-1 netlist and 12-2 netlist, to generate a pre-simulated netlist or source netlist

290. Source netlist 290 describes how the signals communicate between each chip layer. For example, in FIG. 4, net1 and net2 refer to the signal communication between chip layer 12-1 and chip layer 12-2. Then a software module or software program within EDA tool 123, such as "search inter-chip propagation port utility" module or also referred to as the share port creation module 128 (shown in FIG. 2), is used to determine the inter-layer ports that are being shared between the chip layers, such as chip layer 12-1 and 12-2, based on the signal communication. The "search inter-chip propagation port utility" module can be internally developed to be used by the designer or foundry.

In some embodiments, the module or software uses an algorithm, such as "find the same net name in the source netlist's top subckt and trace the share port name in the chip subckt by the same name" to facilitate identifying ports on two chip layers that, for example, share the same net name or share at least one coordinate. When using the algorithm "find the same net name in the source netlist's top subckt and trace the share port name in the chip subckt by the same name", EDA tool 123 identifies the signal that will propagate from one chip to another chip. If the signal will propagate from one chip to another chip, each of the chips will typically have a port that has the same net name or coordinate to facilitate the signal propagation between the chips. For example, as shown in FIG. 4, upon using the above-referenced algorithm on the source netlist 290, share ports 292 are created for the signal communication A1 and C2. The created share ports 292 include the ports within two chip layers, such as chip layer 12-1 and 12-2, that share at least one coordinate, such as the x, y coordinate. While the example for the process described herein for the creation of the share ports is provided for a stacked chip configuration, the same process can also be applied to single chip stacked CMOS configurations.

Referring to FIG. 3, a layout is also created for each of the chip layers. For example, a layout is created for layer 12-1 (12-1 layout), layer 12-2 (12-2 layout), and through layer 12-n (12-n layout). Each layout can be saved to memory device 118. In some embodiments, each layout is created without using the share ports identified for the respective chip layers. An LVS check is then conducted for each created layout of each chip layer and the respective created share ports. As shown in FIG. 5, in some embodiments, the layout for each chip layer, such as 12-1 and 12-2, is included with the share ports to compare with the source netlist.

Referring to FIG. 3, each LVS check for each of the layouts is then identified as to whether it is clean (i.e., correct) or not clean (i.e., incorrect). In some embodiments, each correct LVS check corresponds to a correct connection for the respective chip and each incorrect LVS check corresponds to an incorrect connection, a missing port, or a device property error for the respective chip. In some embodiments, EDA tool 123 includes verification module 129 (shown in FIG. 2) to that is a verification tool, such as IC Compiler, or ICValidator Synopsys of Mountain View, Calif., Cadence System Development Suite (e.g.,: SoC Encounter, Cadence Physical Verification System) by Cadence Design Systems, Inc. of San Jose, Calif., and "CALIBRE® INROUTE" by Mentor Graphics of Wilsonville, Oreg. Verification module 129 can verify each LVS check.

When verification module 129 identifies that each LVS check is correct, then the connectivity for each chip is correct and an RC extraction can be performed using RC extraction tool 124 (shown in FIG. 2). Alternatively, when an LVS check is incorrect, verification module 129 will show a connectivity error, a missing port error, or a device property error, in some embodiments. For example, when there is an incorrect propagation port, verification module 129 will show a connectivity error for the respective chip layer. When there is no propagation port present on the design of the chip layer, then verification module 129 will show a missing port error for the chip layer. When an LVS check for any of the chip layouts is deemed as being incorrect, then the design for each chip layer and each respective share port is reviewed and the problem identified by verification module 129 is corrected in the design. The process can be repeated until the LVS check is determined as being correct for each chip layout. By using this approach of considering the inter-layer ports or share ports, system 100 does not need to import multiple GDS II files and, as a result, memory overflow and/or runtime issues can be avoided.

Figure 6:
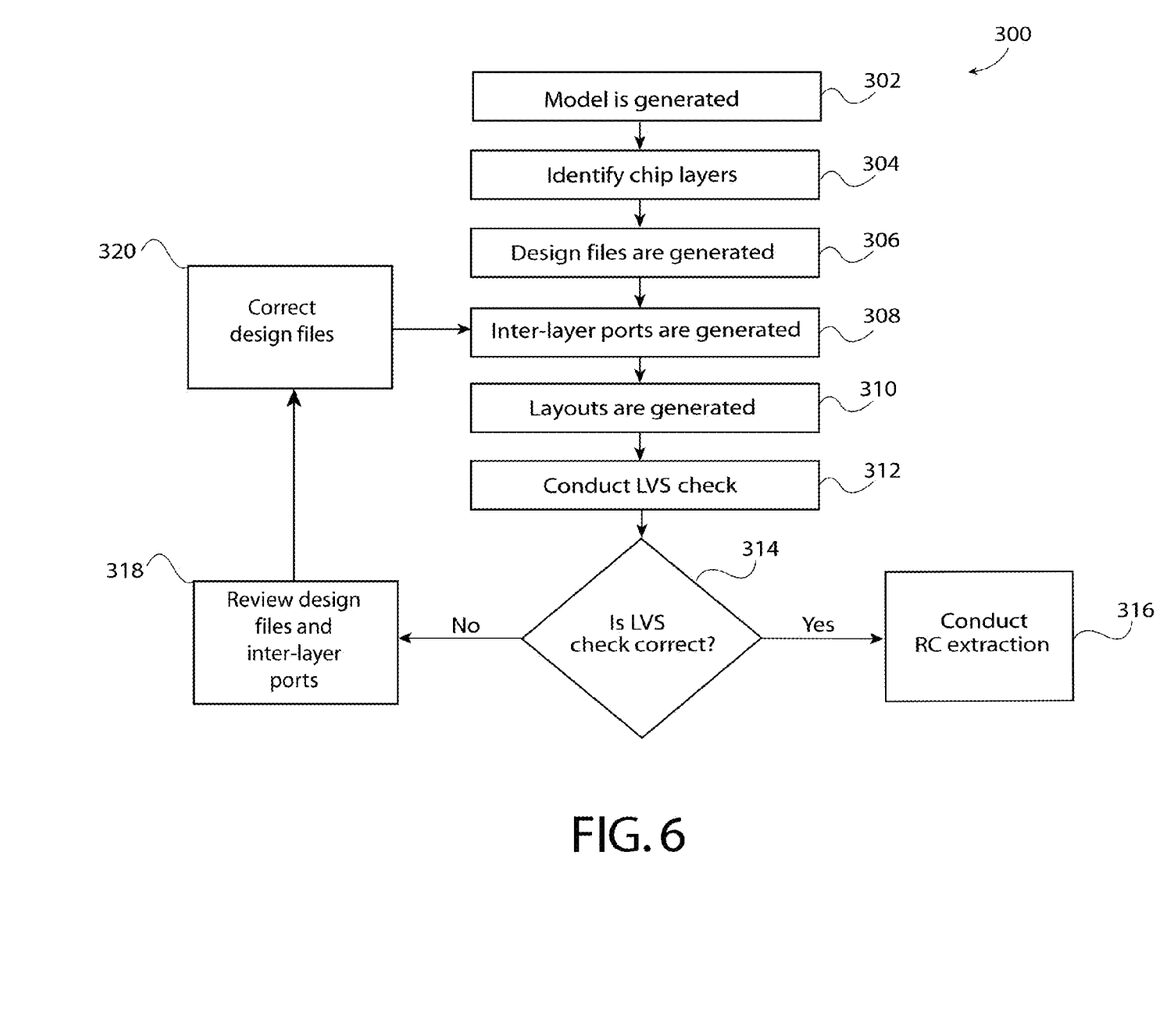
FIG. 6 is a flow diagram of a method for checking the inter-chip connectivity of the 3D IC using the system shown in FIG. 2 in accordance with some embodiments.

FIG. 6 is a flow diagram 300 of a method for checking the inter-chip connectivity of a 3D IC, such as 3D IC 10 (shown in FIG. 1) using system 100 (shown in FIG. 2). In step 302, a model (shown in FIG. 2, within block 118), such as a network model, of 3D IC 10 is generated, wherein the model is representative of the layers or chips, such as layers 12-1, 12-2, 12-3, and 12-n, of 3D IC 10, including any connections therebetween, such as TSVs or ILVs (not shown). In step 304, the processor identifies each of the chips, such as layers 12-1 and 12-2, of the 3D IC 10.

A design file is then generated for the each of the chips in step 306. In some embodiments, each of the design files includes a netlist. In some embodiments, a design file, such as a netlist (shown in FIG. 2, within block 118), is first created for each chip. For example, a netlist is created for chip layer 12-1 (12-1 netlist)(shown in FIG. 3), chip layer 12-2 (12-2 netlist) (shown in FIG. 3), and through chip layer 12-n (12-n netlist) (shown in FIG. 3).

Using the netlists or design files that are generated for each of the chips, in step 308, EDA tool 123 (shown in FIG. 2) generates a plurality of inter-layer ports or share ports that are shared between at least two of the chips. For example, in some embodiments, EDA tool 123 uses each netlist that is generated for each chip layer, such as 12-1 netlist and 12-2 netlist, to generate a pre-simulated netlist or source netlist 290 (shown in FIG. 4) to generate share ports, such as share ports 292 (shown in FIG. 4). Source netlist 290 describes how the signals communicate between each chip layer. For example, in FIG. 4, net1 and net2 refer to the signal communication between chip layer 12-1 and chip layer 12-2. Then module, such as "search inter-chip propagation port utility" module or also referred to as the share port creation module 128 (shown in FIG. 2), is used to determine the share ports that are being shared between the chip layers, such as chip layer 12-1 and 12-2, based on the signal communication. In some embodiments, the module or software uses an algorithm, such as "find the same net name in the source netlist's top subckt and trace the share port name in the chip subckt by the same name" to facilitate identifying ports on two chip layers that, for example, share the same net name, which has it's coordinate.

In step 310, a layout (shown in FIG. 2, within block 118) for each of the chips is generated based on the design files/netlists. For example, a layout is created for layer 12-1 (12-1 layout) (shown in FIG. 3), layer 12-2 (12-2 layout) (shown in FIG. 3), and through layer 12-n (12-n layout) (shown in FIG. 3). In some embodiments, each layout is created without using the share ports identified for the respective chip layers.

In step 312, an LVS check is conducted for each of the generated layouts using the respective created share ports. As shown in FIG. 5, in some embodiments, the layout for each chip layer, such as 12-1 and 12-2, is compared with the respective created share ports.

In step 314, EDA tool 123 identifies whether the LVS check for each of the layouts is correct by using verification module 129 (shown in FIG. 2). In some embodiments, each correct LVS check corresponds to a correct connection for the respective chip and each incorrect LVS check corresponds to an incorrect connection, a missing port, or a device property error for the respective chip. When verification module 129 identifies that each LVS check is correct, then the connectivity for each chip is correct and an RC extraction can be performed using RC extraction tool 124 (shown in FIG. 2) in step 316. Alternatively, when an LVS is incorrect, verification module 129 will show a connectivity error, a missing port error, or a device property error. When an LVS check for any of the chip layouts is deemed as being incorrect, then the design for each chip layer and each respective share port is reviewed in step 318 and the problem identified by verification module 129 is corrected in the respective design in step 320. Share ports can then be created from the corrected designs pursuant to step 308 and new layouts can be generated pursuant to step 310. The process is repeated for steps 312 and 314 until each LVS check is determined as being correct.

As compared to other verification techniques for checking inter-chip connectivity in 3D ICs, the embodiments of the method and system described herein facilitate a technique to check an inter-chip connectivity of a 3D IC without having to import multiple GDS II files. For example, in some embodiments, rather than importing multiple GDS II files, respective design files for each of the chips of the 3D IC are created and the design files are used to identify a plurality of inter-layer ports or share ports that are being shared between at least two of the chips. Respective layouts without the share ports for each of the chips are generated, and a layout versus schematic (LVS) check is conducted for each of the generated layouts by using the identified inter-layer ports or share ports to check the inter-chip connections. As such, multiple GDS II files are not imported in which case, memory overflow and/or runtime issues can be avoided.

In some embodiments, a method for checking the inter-chip connectivity of a 3D IC includes receiving a design file for each of a plurality of chips of the 3D IC and generating a plurality of inter-layer ports to be shared between at least two of the chips based on the design files for each of the chips. A layout for each of the chips based on the design files for each of the chips is generated without the share ports and a layout versus schematic (LVS) check is conducted for each of the generated layouts by using the identified inter-layer ports.

In some embodiments, a system includes a non-transient machine readable storage medium that stores a design file that is generated by an EDA tool for each of a plurality of chips of a 3D IC, wherein each of the chips are stacked with respect to each other. An RC tool is within the EDA tool such that the EDA tool is configured to generate a plurality of inter-layer ports to be shared between at least two of the chips based on the generated design files. The EDA tool is also configured to generate a layout without the share ports for each of the chips based on the generated design files. The EDA tool is further configured to conduct an LVS check for each of the generated layouts by using the identified inter-layer ports.

In some embodiments, at least one non-transitory computer-readable storage medium having computer-executable instructions embodied thereon, wherein, when executed by at least one processor, the computer-executable instructions cause the processor to receive a design file for each of a plurality of chips of a 3D IC and to generate a plurality of inter-layer ports to be shared between at least two of the chips based on the generated design files. The computer-executable instructions further cause the processor to generate a layout without the share ports for each of the chips based on the generated design files. Moreover, the computer-executable instructions cause the processor to conduct an LVS check for each of the generated layouts by using the identified inter-layer ports.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method for checking the inter-chip connectivity of a three-dimensional (3D) integrated circuit (IC) using a computer, said method comprising:
    receiving a plurality of design files for a plurality of chips of the 3D IC such that each of the design files corresponds to a different chip, using the computer;
    generating, using the computer, a pre-simulated design file using the plurality of design files, wherein the pre-simulated design file identifies as least one signal communication between each of the plurality of chips;
    generating a plurality of inter-layer ports to be shared between at least two of the plurality of chips based on the pre-simulated design file, using the computer;
    generating a layout for each of the plurality of chips based on the design files for each of the plurality of chips; and
    conducting a layout versus schematic (LVS) check for each of the generated layouts by using the identified plurality of inter-layer ports.

2. The method of claim 1, further comprising identifying whether the LVS check for each of the generated layouts is correct or incorrect, wherein each correct LVS check corresponds to a correct connection in the 3D IC and each incorrect LVS check corresponds to an incorrect connection for the respective chip, a missing port for the respective chip.

3. The method of claim 2, further comprising performing an RC extraction of each of the generated layouts when the LVS check for each of the generated layouts is identified as being correct.

4. The method of claim 2, further comprising checking the connection for each of the plurality of chips when the LVS check is identified as being incorrect for each of the plurality of chips.

5. The method of claim 1, wherein each of the design files comprises a netlist and the pre-simulated design file comprises a pre-simulated netlist.

6. The method of claim 1, wherein generating a plurality of inter-layer ports comprises identifying at least two inter-layer ports that have the same name in at least two of the plurality of chips.

7. The method of claim 1, wherein generating a plurality of inter-layer ports comprises identifying at least two inter-layer ports that have the same at least one coordinate value in at least two of the plurality of chips.

8. A system comprising:
a non-transitory machine readable storage medium storing a plurality of design files that are generated by an electronic design automation ("EDA") tool for a plurality of chips of a three-dimensional (3D) integrated circuit (IC) such that each of the design files corresponds to a different chip, wherein each of the plurality of chips are stacked with respect to each other; and
an RC tool within the EDA tool such that the EDA tool is configured to:
generate a pre-simulated design file using the plurality of design files, wherein the pre-simulated design file identifies as least one signal communication between each of the plurality of chips;
generate a plurality of inter-layer ports to be shared between at least two of the plurality of chips based on the pre-simulated design file;
generate a layout for each of the plurality of chips based on the design files for each of the plurality of chips; and
conduct a layout versus schematic (LVS) check for each of the generated layouts by using the identified plurality of inter-layer ports.

9. The system of claim 8, wherein the EDA tool is further configured to identify whether the LVS check for each of the generated layouts is correct or incorrect, wherein each correct LVS check corresponds to a correct connection for the 3D IC and each incorrect LVS check corresponds to an incorrect connection for the respective chip, a missing port for the respective chip.

10. The system of claim 9, wherein the EDA tool is further configured to perform an RC extraction of each of the generated layouts when the LVS check for each of the generated layouts is identified as being correct.

11. The system of claim 9, wherein the EDA tool is further configured check the connection for each of the plurality of chips when the LVS check is identified as being incorrect for each of the plurality of chips.

12. The system of claim 8, wherein each of the plurality of generated design files includes a netlist and the pre-simulated design file includes a pre-simulated netlist.

13. The system of claim 8, wherein the generated plurality of inter-layer ports include at least two inter-layer ports that have the same name in at least two of the plurality of chips.

14. The system of claim 8, wherein the generated plurality of inter-layer ports include at least two inter-layer ports that have the same at least one coordinate value in at least two of the plurality of chips.

15. At least one non-transitory computer-readable storage medium having computer-executable instructions embodied thereon, wherein, when executed by at least one processor, the computer-executable instructions cause the at least one processor to:
receive a plurality of design files for a plurality of chips of the 3D IC such that each of the design files corresponds to a different chip;
generate a pre-simulated design file using the plurality of design files, wherein the pre-simulated design file identifies as least one signal communication between each of the plurality of chips;
generate a plurality of inter-layer ports to be shared between at least two of the plurality of chips based on the pre-simulated design file;
generate a layout for each of the plurality of chips based on the design files for each of the plurality of chips; and
conduct a layout versus schematic (LVS) check for each of the generated layouts by using the identified plurality of inter-layer ports.

16. The at least one non-transitory computer-readable storage medium of claim 15, wherein the computer-executable instructions further cause the at least one processor to identify whether the LVS check for each of the generated layouts is correct or incorrect, wherein each correct LVS check corresponds to a correct connection for 3D IC and each incorrect LVS check corresponds to an incorrect connection for the respective chip, a missing port for the respective chip, or a device property error for the respective chip.

17. The at least one non-transitory computer-readable storage medium of claim 16, wherein the computer-executable instructions further cause the at least one processor to perform an RC extraction of each of the generated layouts when the LVS check for each of the generated layouts is identified as being correct.

18. The at least one non-transitory computer-readable storage medium of claim 16, wherein the computer-executable instructions further cause the at least one processor to check the connection for each of the plurality of chips when the LVS check is identified as being incorrect for each of the plurality of chips.

19. The at least one non-transitory computer-readable storage medium of claim 15, wherein the computer-executable instructions cause the at least one processor to generate the design file for each of the plurality of chips by causing the at least one processor to generate a netlist for each of the plurality of chips.

20. The at least one non-transitory computer-readable storage medium of claim 15, wherein the computer-executable instructions cause the at least one processor to generate the plurality of inter-layer ports by causing the at least one processor to at least one of identify at least two inter-layer ports that have the same name in at least two of the plurality of chips or identify at least two inter-layer ports that have the same at least one coordinate value in at least two of the plurality of chips.

* * * * *